(12) United States Patent
Kim

(10) Patent No.: US 6,950,364 B2
(45) Date of Patent: Sep. 27, 2005

(54) SELF-REFRESH APPARATUS AND METHOD

(75) Inventor: Tae Yun Kim, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 112 days.

(21) Appl. No.: 10/728,765

(22) Filed: Dec. 8, 2003

(65) Prior Publication Data

US 2004/0156249 A1 Aug. 12, 2004

(30) Foreign Application Priority Data

Feb. 10, 2003 (KR) .................................. 10-2003-0008257

(51) Int. Cl.[7] .............................................. G11C 7/00
(52) U.S. Cl. .................................... 365/222; 365/233.5
(58) Field of Search ........................... 365/222, 230.03, 365/233.5

(56) References Cited

U.S. PATENT DOCUMENTS

| 4,933,907 A | * | 6/1990 | Kumanoya et al. | ......... 365/222 |
| 5,270,982 A | * | 12/1993 | Watanabe | .................... 365/222 |
| 2004/0093461 A1 | * | 5/2004 | Kim | ............................ 711/106 |

FOREIGN PATENT DOCUMENTS

JP     2003091989 A  *  3/2003  ......... G11C/11/406

* cited by examiner

*Primary Examiner*—Tan T. Nguyen
(74) *Attorney, Agent, or Firm*—Heller Ehrman LLP

(57) ABSTRACT

The present invention relates to a self-refresh apparatus and method. In the self-refresh method according to the present invention, when a partial array self-refresh operation is performed on a bank, internal address is counted in a predetermined cycle corresponding to a refresh rate regardless of PASR types. The bank is selectively activated depending on the PASR types. As a result, errors of the refresh rate which result from a half of bank or quarter of bank self refresh operation can be prevented.

13 Claims, 15 Drawing Sheets

SELF-REFRESH APPARATUS AND METHOD

BACKGROUND OF THE INVENTION

1. Field of the Invention

The present invention relates to a self-refresh apparatus and method for correcting self-refresh rate error which may be generated when a partial array self-refresh (hereinafter, referred to as "PASR") operation is performed on a half of bank or a quarter of bank.

2. Description of the Background Art

A DRAM is used as a main memory device in most computer systems, whose cell requires a refresh operation to prevent loss of data.

A conventional semiconductor memory device performs a refresh operation on all cell arrays regardless of data storage in each cell, because an additional memory means for memorizing whether data are stored in each cell is required in the memory device.

As a result, a PASR operation is performed in order to solve the above-described problem.

The PASR operation may reduce power consumption because it is performed on a cell array having data during the same cycle.

For example, if a refresh operation is performed on only a half of a bank during a refresh rate, power consumption is reduced in half.

FIG. 1 is a diagram illustrating a self-refresh operation performed on cell arrays of a bank in a conventional memory 10 comprising four banks.

The memory cell arrays of a bank <2> are divided into two "HALF OF BANK"s (HOB) 15 and 16. Wordlines 11 and 12 are first and last wordlines of the "HALF OF BANK" 15. Wordlines 13 and 14 are first and last wordlines of the "HALF OF BANK" 16.

FIG. 2 is a timing diagram illustrating a self-refresh operation performed on "ALL BANK" for explaining a refresh rate. FIG. 3 is a timing diagram illustrating a self-refresh operation performed on "HALF of BANK" for explaining the refresh rate error.

When a refresh operation is performed on the bank <2>, an internal counter counts from wordline 11 to wordline 14. Here, a refresh rate is supposed to be 64 msec.

When an auto-refresh or self-refresh command (ALL BANK PASR) is performed on the whole bank <2>, the refresh operation time on each "HALF OF BANK" 15 and 16 is 32 m/sec. The refresh operation time on the whole bank <2> is 64 m/sec. That is, all wordlines 11~14 should be consecutively activated in order to refresh all cells on the bank <2>. Here, it takes about 64 m/sec to re-activate the first wordline 11.

When the PASR operation is performed on a "HALF OF BANK", the wordlines 11~12 are consecutively activated for 64 msec.

According to a method of performing the PASR operation on the "half of bank" for 64 msec, the pulse interval of the refresh requiring signal is extended twice as much, and only internal addresses of cell arrays storing data are counted. Further, when a PASR operation is performed on a "QUARTER OF BANK" for 64 msec, the pulse interval of the refresh requiring signal is extended four times as much, and only internal address of cell arrays storing data are counted.

However, when the above-described self-refresh operation is performed on the "HALF OF BANK", a self-refresh command on the "HALF OF BANK" is set as an EMRS (Extended Mode Register Set) code, and then the self-refresh operation is performed on the wordlines 11~12, consecutively. After the self-refresh operation is performed on the wordline 12, the self-refresh operation is finished by an external command. Here, the self-refresh time performed on the wordlines 11~12 is 64 msec.

As shown in FIGS. 2 and 3, the section "B" of FIG. 3 is twice longer than the section "A" of FIG. 2.

After the self-refresh operation is finished, an auto-refresh is performed pursuant to an auto-refresh command during the normal operation. Here, the internal address counter starts to count the wordline 13 in response to the auto-refresh command because the self-refresh operation is finished at the wordline 12.

That is, if the self-refresh operation is not finished, the internal address counter starts to recount the wordline 11. However, since the self-refresh operation is finished, the internal address counter starts to count the wordline 13 by a pulse interval "A" of FIG. 2.

It takes 32 msec to perform the auto-refresh operation consecutively from the wordline 13 to the wordline 14. As a result, it takes 96 msec to re-perform a refresh operation on the wordline 11 as shown in FIG. 3.

The refresh operation is performed on the wordline 11 after 96 msec although the refresh operation should be performed on each wordline per about 64 msec in a memory having a refresh rate of 64 msec, which may cause loss of data.

SUMMARY OF THE INVENTION

Accordingly, it is an object of the present invention to provide a self-refresh apparatus which prevents refresh rate error by counting internal address in a predetermined cycle corresponding to a refresh rate regardless of types of PASR in a PASR mode.

In an embodiment, there is provided a self-refresh apparatus comprising an internal address counter, a refresh controller and a row address strobe generator.

The refresh controller outputs a signal as an internal operation signal for counting internal address in response to a refresh command signal. Here, the signal has a predetermined cycle corresponding to a refresh rate The internal address counter counts internal address in response to the internal operation signal.

When a PASR command signal on a bank is applied, the refresh controller selectively outputs the signal having a predetermined cycle depending on counting values of the internal address. Here, the signal is used as a refresh operation signal for activating the bank. The row address strobe generator selectively activates the bank in response to the refresh operation signal.

In an embodiment, there is provided a self-refresh method wherein when a PASR operation is performed on a bank, internal address on the bank is continuously counted in a predetermined cycle corresponding to a refresh rate regardless of types of the PASR. However, the corresponding bank is activated only while the internal address is counted to a predetermined address depending on types of the partial array self-refresh.

The self-refresh method for performing a PASR operation on a semiconductor memory comprises: the first step of activating a refresh operation signal for activating a bank and an internal operation signal for counting internal address, when a PASR command on a bank is applied; the second step of checking state change of a specific bit of the counted internal address depending on states of the PASR; and the third step of continuously activating the internal operation signal in a predetermined cycle regardless of state change of the specific bit, and of inactivating the refresh operation signal when the state of the specific bit is changed.

DETAILED DESCRIPTION OF THE PREFERRED EMBODIMENTS

The present invention will be described in detail with reference to the accompanying drawings.

Figure 4:
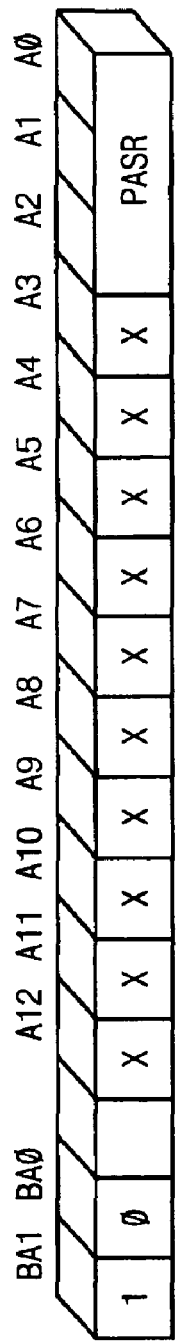
FIG. 4 is a diagram illustrating an EMRS code according to an embodiment of the present invention.

FIG. 4 is a diagram illustrating an EMRS code where a refresh type of a refresh apparatus according to an embodiment of the present invention is applied.

Addresses A0~A2 of the EMRS code are used for PASR setup. As a result, when an EMRS command is inputted externally, the refresh apparatus performs a corresponding self-refresh operation depending on EMRS codes as shown in FIG. 4.

When the addresses A0~A2 are all 0, a self-refresh operation is performed on the whole cell array by selecting "ALL BANKS".

Figure 1:
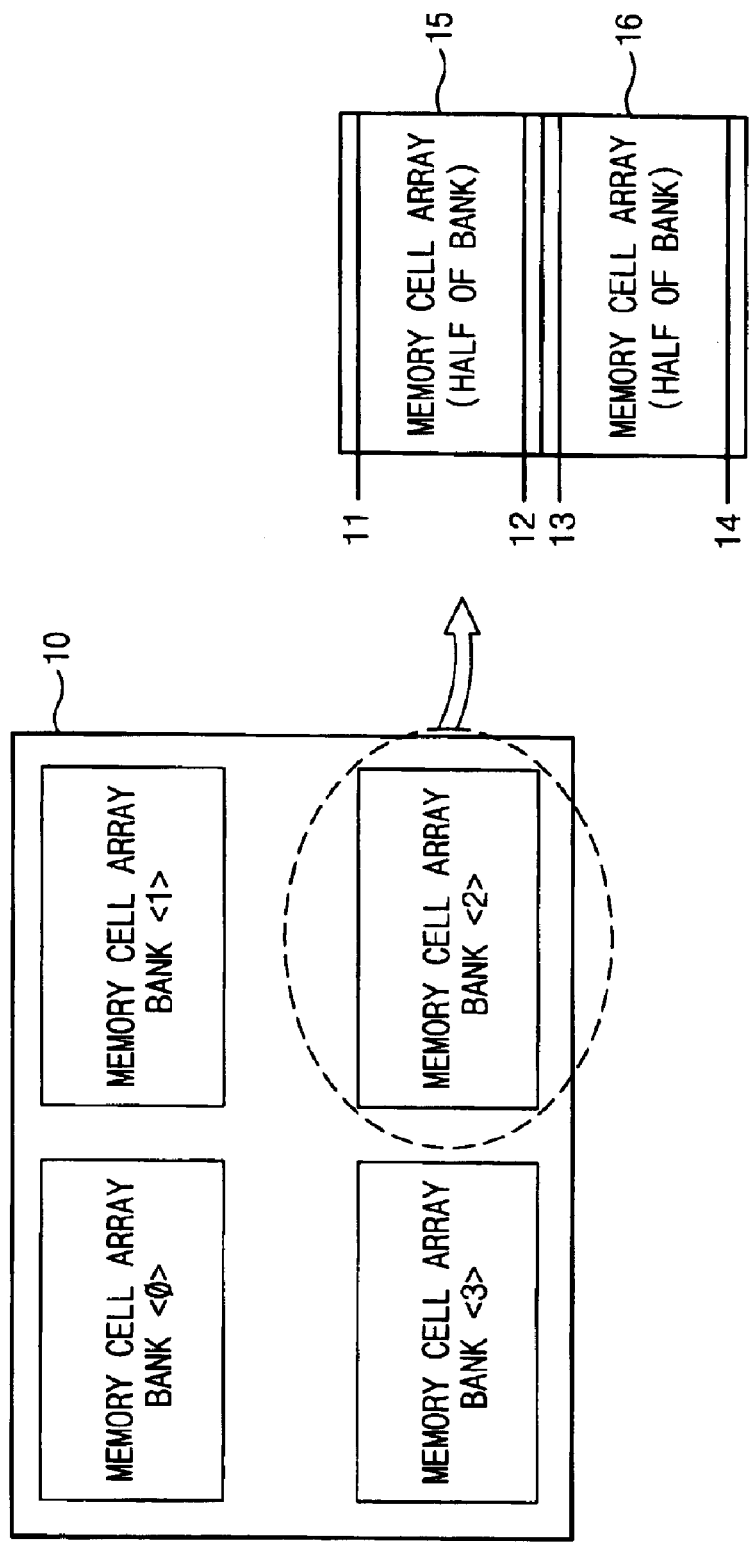
FIG. 1 is a diagram illustrating a structure of general memory bank.
Figure 2:
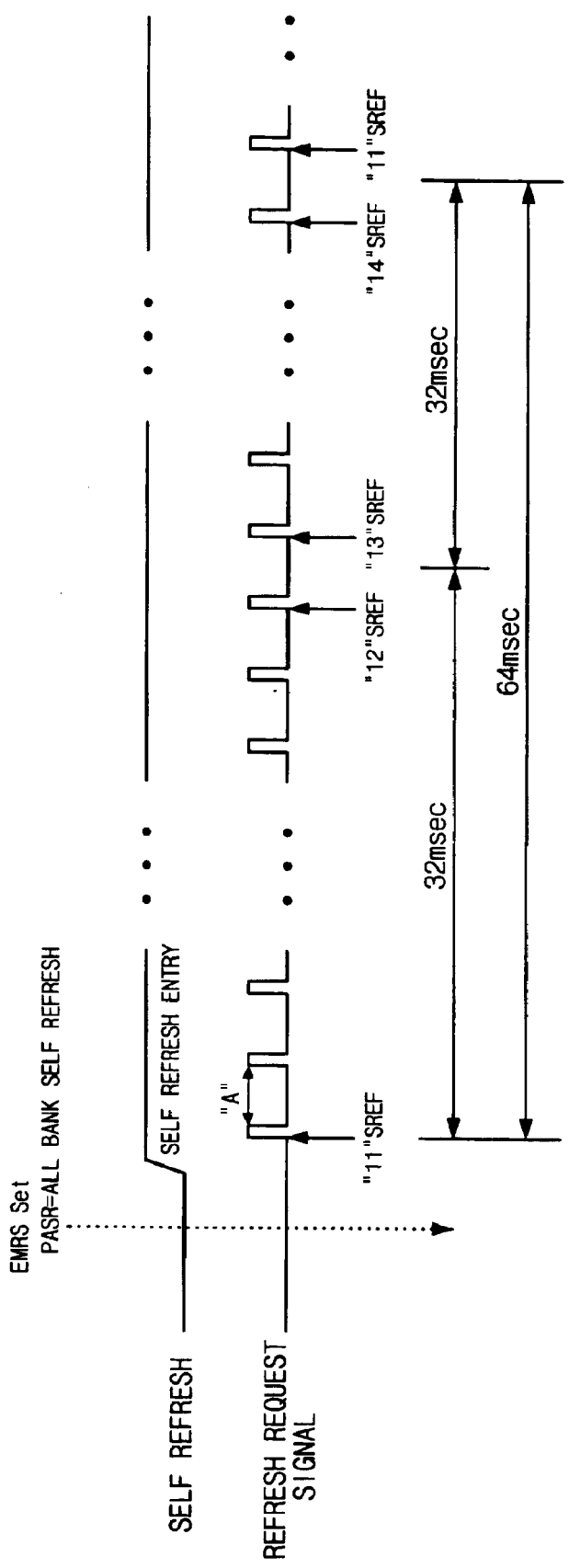
FIG. 2 is a diagram illustrating a refresh rate.
Figure 3:
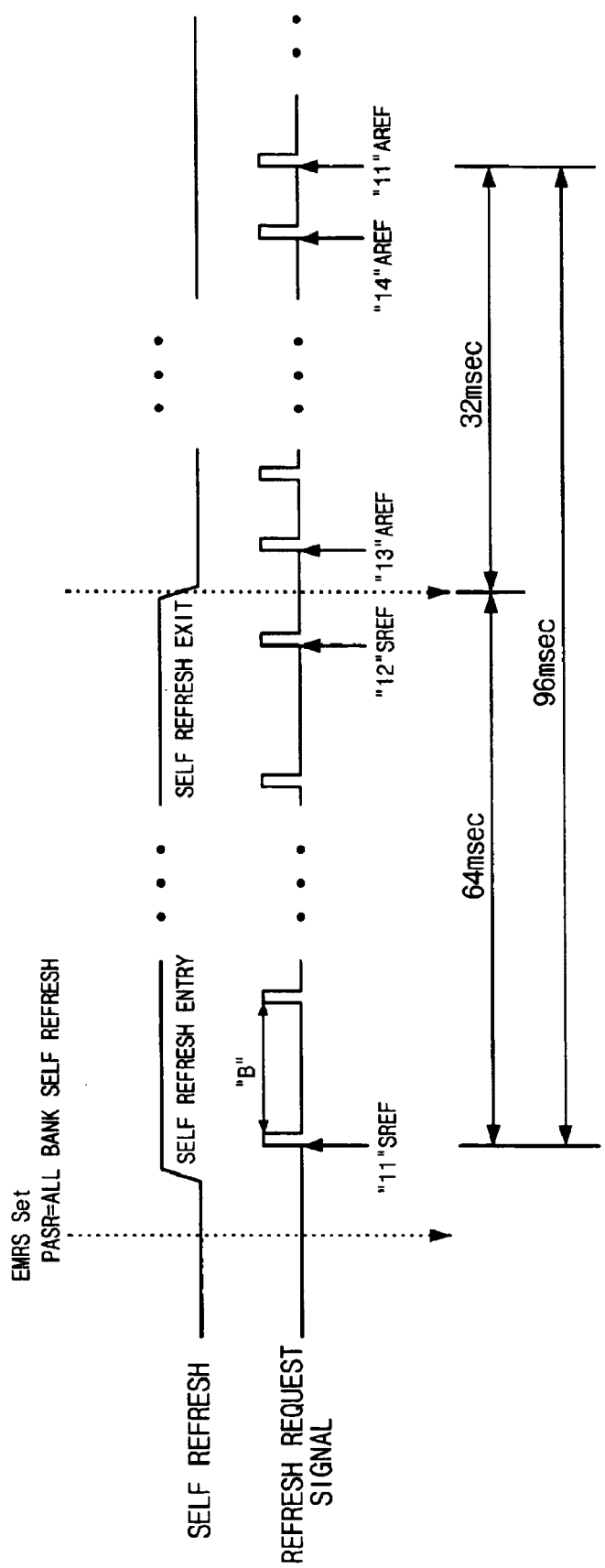
FIG. 3 is a diagram illustrating error of the refresh rate.

When only the address A0 is 1, a self-refresh operation is performed on a half of the whole cell array by selecting a "HALF ARRAY". As shown in FIG. 1, in a DRAM having a four-bank structure, the self-refresh operation is performed on two banks. Here, a bank selecting address BA1 becomes 0.

When only the address A1 is 1, a self-refresh operation is performed on a quarter of the whole cell array by selecting a "QUARTER ARRAY". As shown in FIG. 1, in a DRAM having a four-bank structure, the self-refresh operation is performed on a bank. Here, bank selecting addresses BA0 and BA1 become both 0.

When only the address A1 is 0, a self-refresh operation is performed on a half cell array of a bank by selecting a "HALF of BANK". For example, a self-refresh operation is performed on cell arrays corresponding to the "HALF of BANK" 15 of the bank <2> in FIG. 1. Here, one of the bank selecting addresses BA0 and BA1 which correspond to the most significant bit (MSB) of row address becomes 0.

When only the address A0 is 0, a self-refresh operation is performed on a quarter cell array of a bank by selecting a "QUARTER OF BANK". Here, both of the bank address bits BA0 and BA1, which are the two most significant bits of the row address, become 0.

Additionally, the case when only the address bit A2 is 0, the case when the only the address bit A2 is 1, and the case when all address bits A0~A2 are 1 are reserved for future use (RFU).

Figure 5:
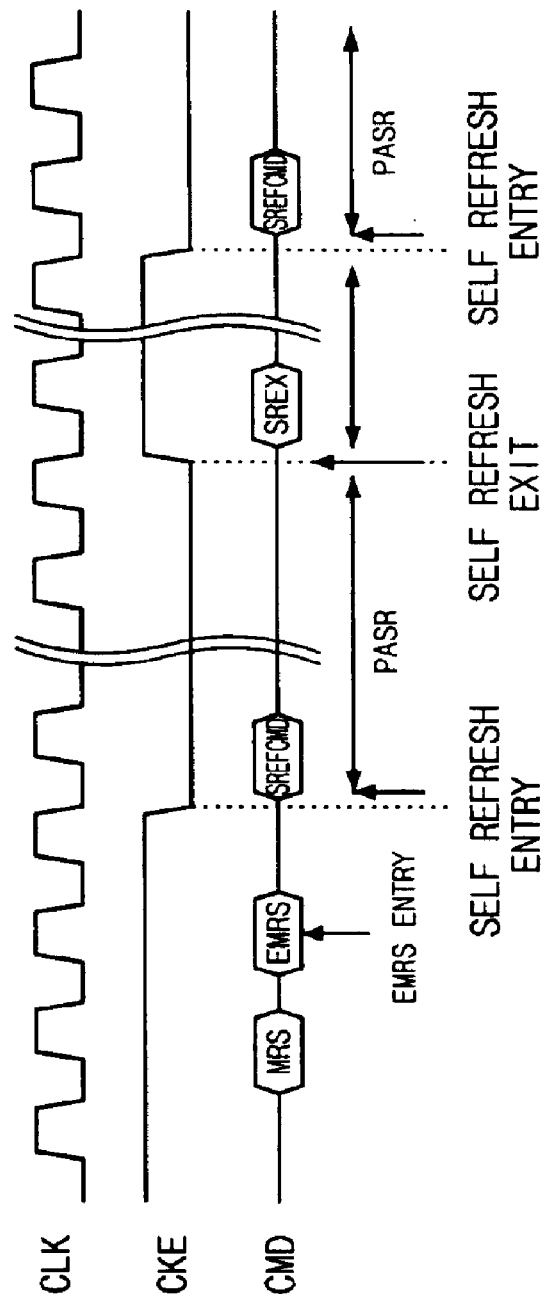
FIG. 5 is a timing diagram illustrating a self-refresh entry and exit mode according to an embodiment of the present invention.

FIG. 5 is a timing diagram illustrating a self-refresh entry and exit mode according to an embodiment of the present invention.

First, a PASR type is preset to the EMRS code. When a self-refresh command SREFCMD is inputted, a self-refresh operation is performed according to the preset PASR type. As a result, a selective self-refresh operation is performed on cell arrays corresponding to the PASR type according to the EMRS code.

Next, when a clock enable signal CKE is enabled to a high level and a self-refresh exit command SREX is inputted, a self-refresh operation is finished and a normal operation is performed. In the normal mode, a self-refresh operation is performed on all cell arrays.

Thereafter, when the self-refresh command SREFCMD is re-inputted, the PASR operation is performed according to the preset EMRS code.

Figure 6:
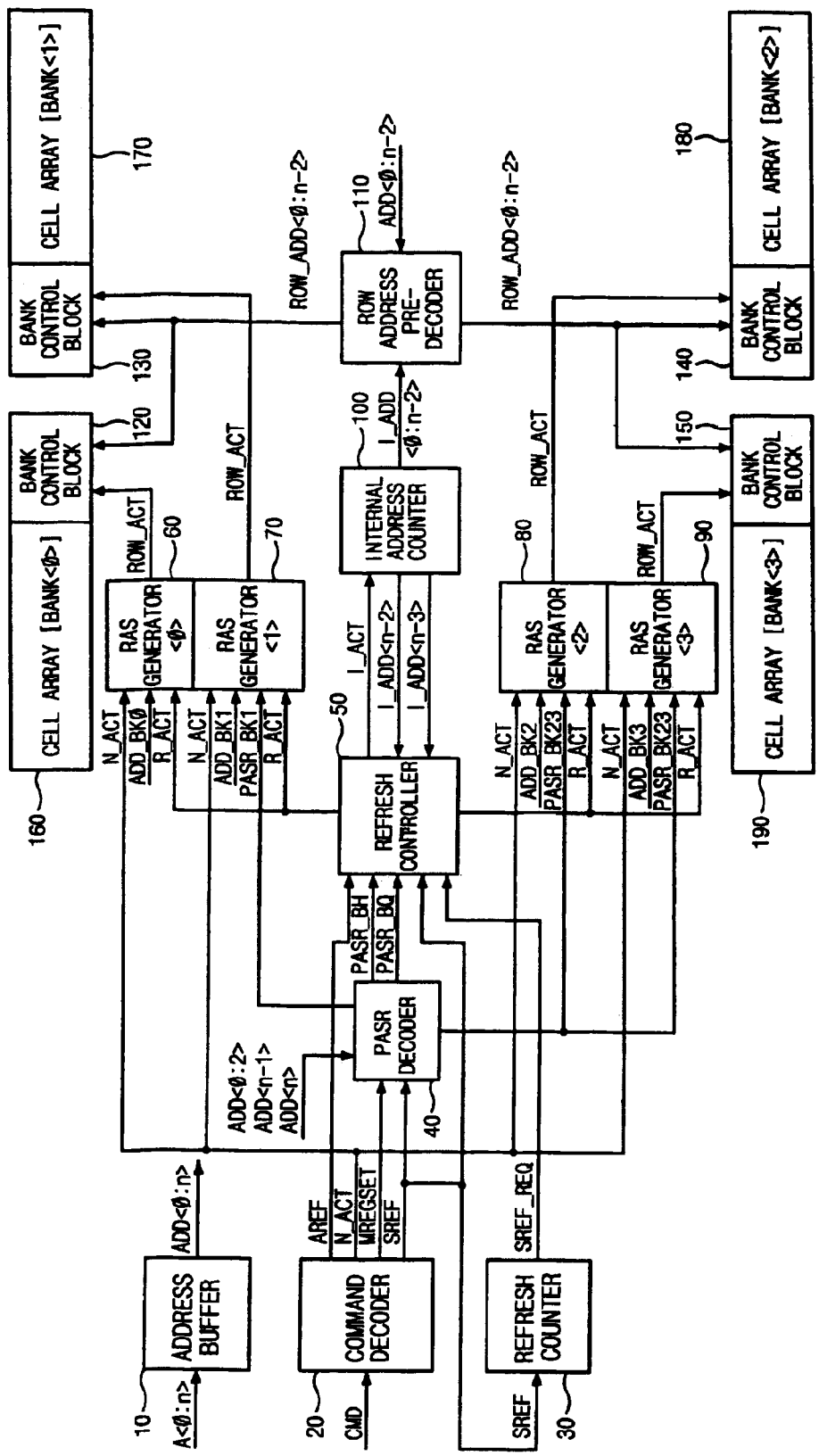
FIG. 6 is a structural diagram illustrating a self-refresh apparatus according to an embodiment of the present invention.

FIG. 6 is a structural diagram illustrating a self-refresh apparatus according to an embodiment of the present invention.

The self-refresh apparatus of FIG. 6 comprises an address buffer 10, a command decoder 20, a refresh counter 30, a PASR decoder 40, a refresh controller 50, RAS (Row Address Strobe) generators 60, 70, 80 and 90, an internal address counter 100, a row address pre-decoder 110, bank control blocks 120, 130, 140 and 150, and cell array banks 160, 170, 180 and 190.

Here, the address buffer 10 buffers an externally inputted address A<0:n>, and outputs the buffered address ADD<0:n>.

The command decoder 20 decodes an externally inputted command CMD, and outputs an auto-refresh signal AREF, a self-refresh signal SREF, a mode register set signal MREGSET and a normal operation signal N_ACT.

When a self-refresh signal SREF representing a self-refresh operation is activated, the refresh counter 30 activates a refresh oscillator and makes it output a self-refresh requiring signal SREF_REQ having a predetermined cycle.

Figure 7:
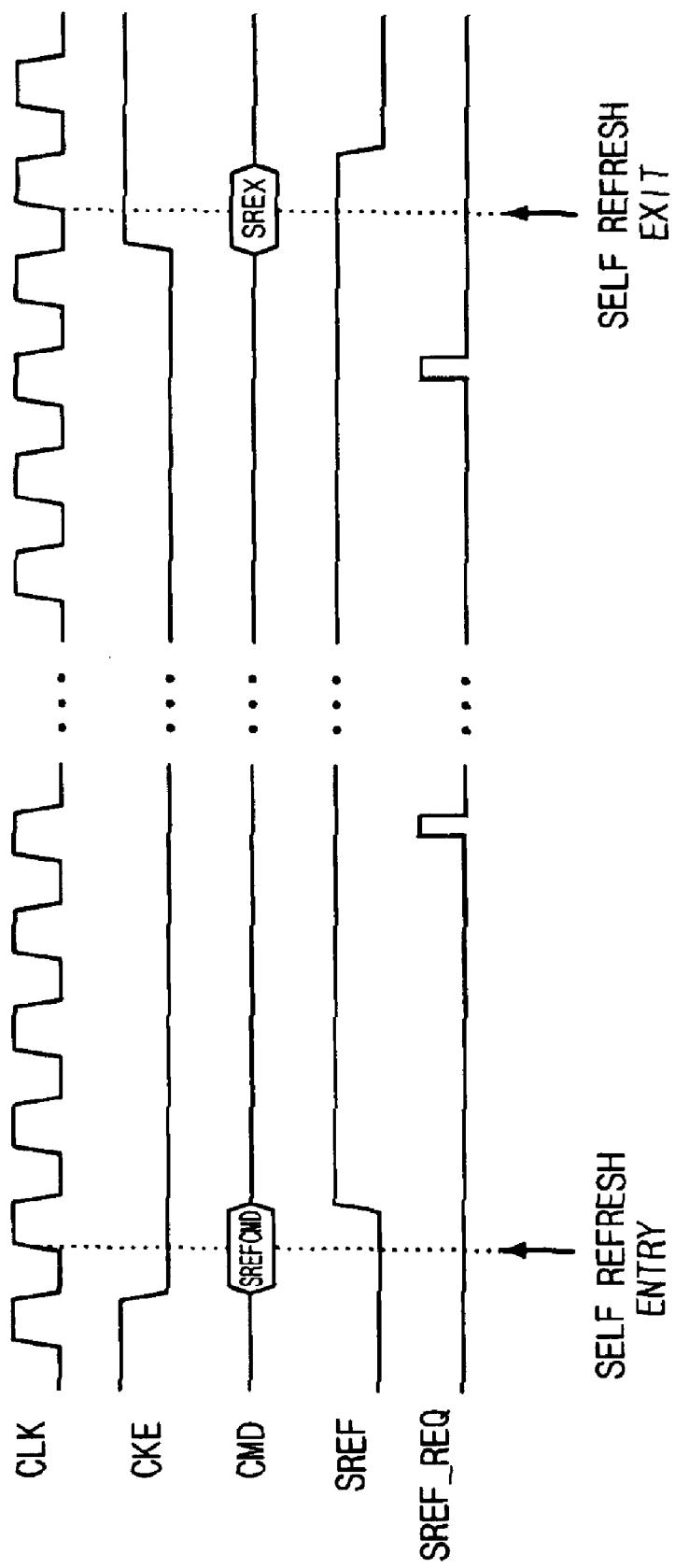
FIG. 7 is a diagram illustrating the relationship between a self-refresh signal and a self-refresh request signal which are activated in response to external commands.

FIG. 7 is a diagram illustrating the relationship between a self-refresh signal SREF and a self-refresh requiring signal SREF_REQ when an external command is inputted.

The self-refresh signal SREF is activated in response to the self-refresh command SREFCMD, and inactivated in response to the self-refresh exit command SREX. In a self-refresh mode, the refresh counter 30 generates the self-refresh requiring signal SREF_REQ as a pulse signal to have a predetermined cycles. For example, when a memory device has a refresh rate for performing a refresh operation on a cell array of 8K for 64 msec, the self-refresh requiring signal SREF_REQ is generated per 7.8 μsec.

The PASR decoder 40 decodes the mode register set signal MREGSET and the self-refresh signal SREF applied from the command decoder 20, and addresses add<n>, add<n-1> and add<0:2> from the address buffer 10 to generate control signals for performing a PASR operation depending on types of PASR. When a PASR type is a "HALF OF BANK" or "QUARTER OF BANK" on a bank, the PASR decoder 40 outputs control signals RASR_BH and PASR_BQ for identifying corresponding PASR types, and control signals PASR_BK1 and PASR_BK23 for selectively activating other banks than the bank.

The refresh controller 50 receives the auto-refresh signal AREF and the self-refresh signal SREF from the command decoder 20, the self-refresh requiring signal SREF_REQ from the refresh counter 30, the control signals PASR_BH and PASR_BQ from the PASR decoder 40, and internal addresses I_ADD<n-2> and I_ADD<n-3> from the internal address counter 100, and generates an internal operation signal I_ACT and a refresh operation signal R_ACT for controlling a refresh operation. Here, the internal operation signal I_ACT is to activate the internal address counter 100 in a predetermined cycle in a refresh (auto-refresh or self-refresh) mode. The refresh operation signal R_ACT is to control a refresh operation on cell arrays of a corresponding bank by controlling the RAS generators 60~90.

When the control signals PASR_BH and PASR_BQ are activated, the refresh controller 50 selectively activates the refresh operation signal R_ACT according to the internal addresses I_ADD<n-2> and I_ADD<n-3> from the internal address counter 100, but the refresh controller 50 continuously activates the internal operation signal I_ACT The RAS generator 60 receives a normal operation signal N_ACT, a bank selecting address ADD_BK0 and a refresh operation signal R_ACT, and outputs a row active signal ROW_ACT<0> into a bank control block 120 for activating a bank 160.

The RAS generator 70 receives a normal operation N_ACT, a bank selecting address ADD_BK1, a refresh operation signal R_ACT and a control signal PASR_BK1, and outputs a row active signal ROW_ACT into a bank control block 130 for activating a bank 170.

The RAS generator 80 receives a normal operation signal N_ACT, a bank selecting address ADD_BK2, a refresh operation signal R_ACT and a control signal PASR_BK23, and outputs a row active signal ROW_ACT into a bank control block 140 for activating a bank 180.

The RAS generator 90 receives a normal operation signal N_ACT, a bank selecting address ADD_BK3, a refresh operation signal R_ACT and a control signal PASR_BK23, and outputs a row active signal ROW_ACT into a bank control block 150 for activating a bank 190.

The internal address counter 100 counts internal addresses in a predetermined cycle corresponding to a refresh rate during the refresh operation in response to the internal operation signal I_ACT from the refresh controller 50, and then outputs an internal address I_ADD<0:n> into the row address pre-decoder 110. The internal address counter 100 outputs internal addresses I_ADD<n-2> and I_ADD<n-3> into the refresh controller 50. According to the internal addresses I_ADD<n-2> and I_ADD<n-3>, the refresh controller 50 may identify whether the refresh operation is performed on a half or quarter of bank.

The row address pre-decoder 110 pre-decodes an externally inputted address ADD<0:n-2> and the internal address I_ADD from the internal address counter 100, and outputs the pre-decoded addresses into each bank control block 120~150.

In a normal mode, the row address pre-decoder 110 generates a row address ROW_ADD<0:n-2> by decoding the external address ADD<0:n-2>, and outputs the row address ROW_ADD<0:n-2> into each bank control block 120~150. In a refresh mode, the row address pre-decoder 110 generates the row address ROW_ADD<0:n-2> by decoding the internal address I_ADD<0:n-2>, and outputs the row address ROW_ADD<0:n-2> into each bank control block 120~150.

Each bank control block 120~150 controls each bank 160~190 comprising cell arrays.

Here, the address ADD<0:n> is a row address ranging from 0 to n corresponding to the memory depth, and the most significant bit of row address is used as a bank selecting address for selecting a bank.

Since two bank selecting addresses are required in a memory having a four-bank structure, the addresses ADD<n> and ADD<n-1> are used as bank selecting addresses. And the address ADD<0:n-2> is used for selecting cell arrays and wordlines of each selected bank.

Figure 8:
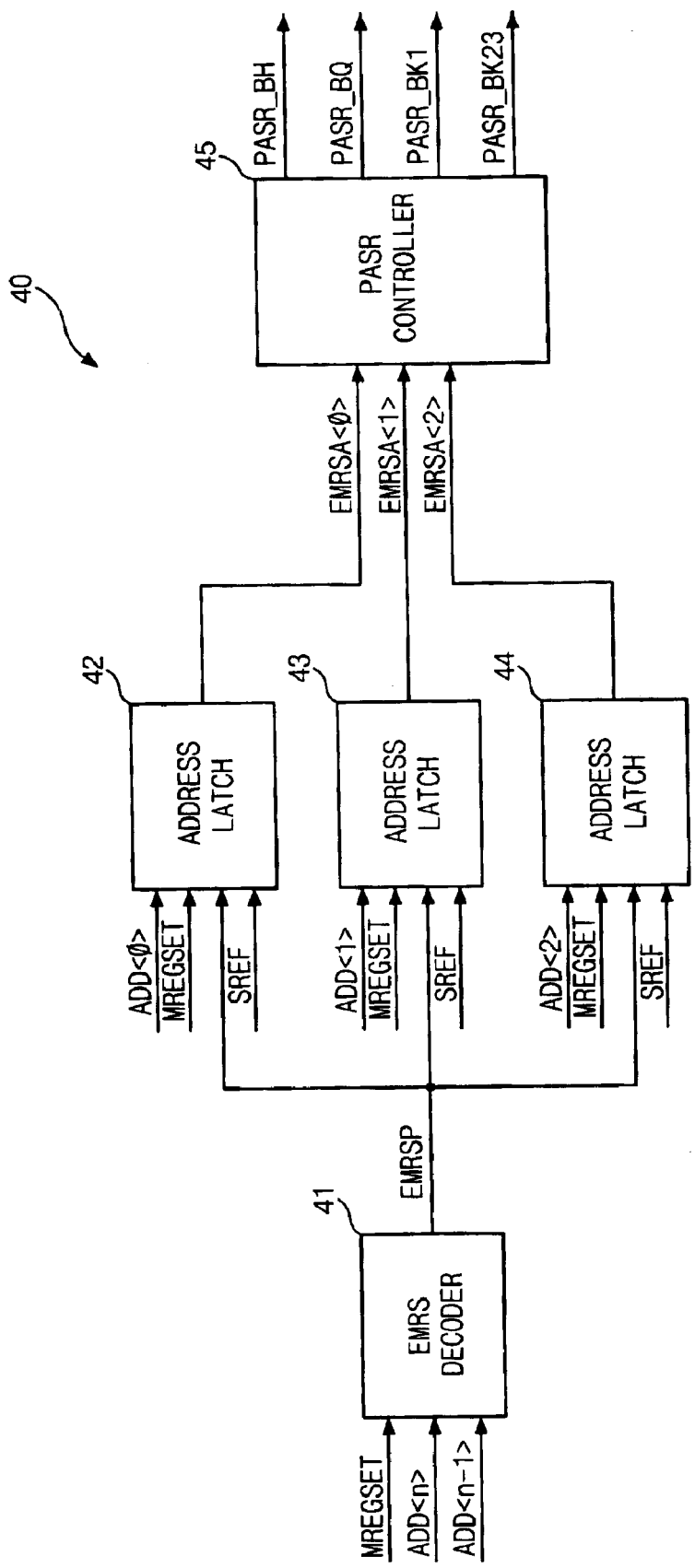
FIG. 8 is a detailed structural diagram illustrating a PASR decoder of FIG. 6.

FIG. 8 is a detailed structural diagram illustrating the PASR decoder 40 of FIG. 6.

The PASR decoder 40 comprises an EMRS decoder 41, address latches 42~44, and a PASR controller 45. The EMRS decoder 41 decodes a EMRS command. The address latches 42~44 latch addresses ADD<0>, ADD<1> and ADD<2> representing PASR codes when an EMRS command inputted. The PASR controller 45 outputs a control signal for performing a PASR operation depending on PASR types.

The EMRS decoder 41 decodes the mode register set signal MREGSET and the bank selecting addresses ADD<n> and ADD<n-1>, and outputs a register set control signal EMRSP.

The address latches 42~44 latch addresses ADD<0>, ADD<1> and ADD<2> in response to the mode register set signal MREGSET, the register set control signal EMRSP and the self-refresh signal SREF, and outputs register set addresses EMRSA<0>, EMRSA<1> and EMRSA<2>.

The PASR controller 45 selectively outputs control signals PASR_BK1, PASR_BK23, PASR_BH and PASR_BQ in response to the register set addresses EMRSA<0>, EMRSA<1> and EMRSA<2>. Here, the control signals PASR_BK1 and PASR_BK23 are to selectively activate banks in a PASR mode. The control signals PASR_BH and PASR_BQ are activated when PASR type is "HALF OF BANK" or "QUARTER OF BANK" respectively.

Figure 9:
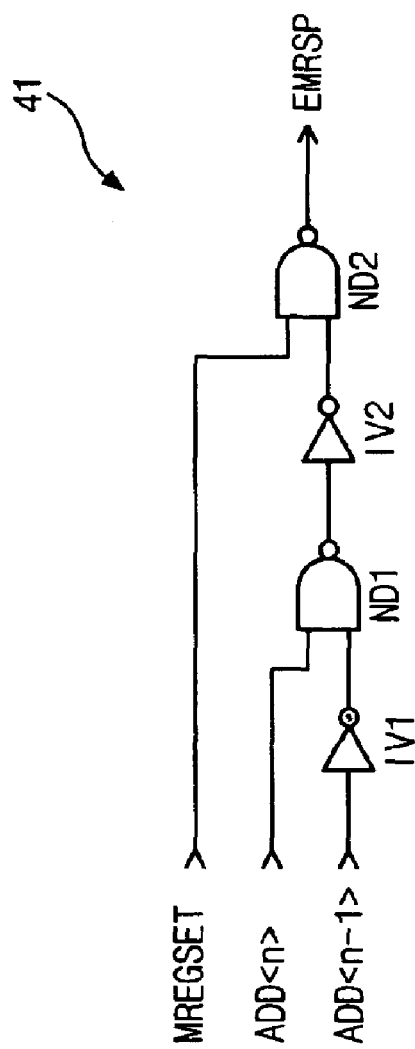
FIG. 9 is a detailed circuit diagram illustrating an EMRS decoder of FIG. 8.

FIG. 9 is a detailed circuit diagram illustrating the EMRS decoder 41 of FIG. 8.

The EMRS decoder 41 comprises an inverter IV1 for inverting the bank selecting address ADD<n-1>, and a NAND gate ND1 for performing a NAND operation on an output signal from the inverter IV1 and the bank selecting address ADD<n>. The EMRS decoder 41 comprises an inverter IV2 for inverting an output signal from the NAND gate ND1, and a NAND gate ND2 for performing a NAND operation on an output signal from the inverter IV2 and the mode register set signal MREGSET and for outputting a register set control signal EMRSP.

The operation of the EMRS decoder 41 is described.

If the mode register set signal MREGSET is activated in the command decoder 20 according to the externally applied EMRS command, the EMRS decoder 41 activates the register set control signal EMRSP corresponding to the EMRS code of FIG. 4 according to the states of bank selecting addresses ADD<n>=BA1 and ADD<n-1>=BA0 of the buffered address ADD<0:n>.

Figure 10:
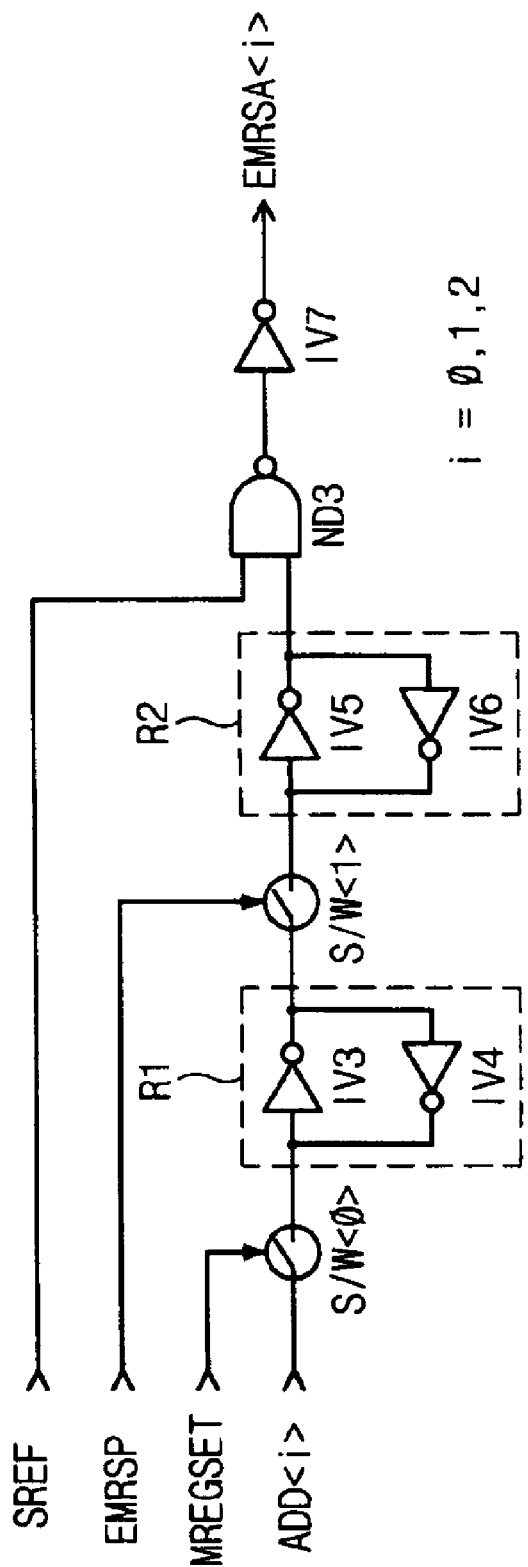
FIG. 10 is a detailed circuit diagram illustrating an EMRS address latch of FIG. 8.

FIG. 10 is a detailed circuit diagram illustrating the EMRS address latch of FIG. 8.

Each address latch 42~44 comprises a switch S/W<0> for selectively outputting address ADD<i> (here, i=0, 1, 2) in response to the mode register set signal MREGSET, and a latch R1 for latching an output signal from the switch S/W<0>. Here, the latch R1 comprises inverters IV3 and IV4 wherein an output signal from the inverter IV3 is inputted into the inverter IV4 and an output signal from the inverter IV4 is inputted into the inverter IV3.

Each address latch 42~44 also comprises a switch S/W<1> for selectively outputting an output signal from the latch R1 in response to the register set control signal EMRSP, and a latch R2 for latching an output signal from the switch S/W<1>. Here, the latch R2 comprises inverters IV5 and IV6 wherein an output signal from the inverter IV5 is inputted into the inverter IV6 and an output signal from the inverter IV6 is inputted into the inverter IV5.

Each address latch 42~44 also comprises a NAND gate ND3 for performing a NAND operation on the self-refresh signal SREF and an output signal from the latch R2, and an inverter IV7 for inverting an output signal from the NAND gate ND3 and outputting the register set address EMRSA<i> (here, i=0, 1, 2).

Each address latch 42~44 controls the switches S/W<0> and S/W<1> in response to the mode register set signal MREGSET and the register set control signal EMRSP, and latches the address ADD<0:2> inputted with the EMRS command. Each address latch 42~44 also activates the register set address EMRSA<i> depending on input of the self-refresh signal SREF. Although the address latch latches the EMRS codes, the register set address EMRSA<i> is not activated when the self-refresh signal SREF is inactivated.

Figure 11:
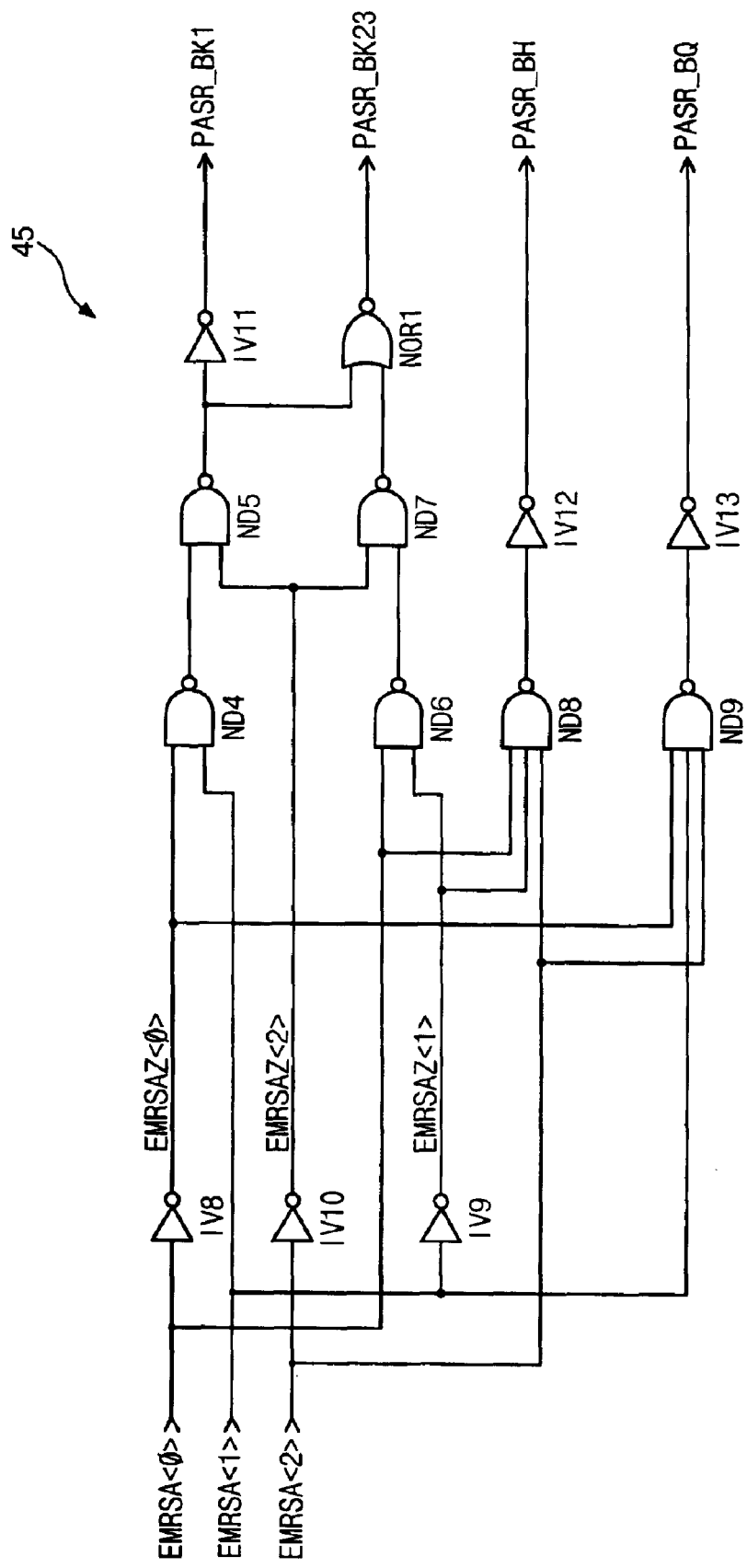
FIG. 11 is a detailed circuit diagram illustrating a PASR controller of FIG. 8.

FIG. 11 is a detailed circuit diagram illustrating the PASR controller 45 of FIG. 8.

An inverter IV8 inverts the register set address EMRSA<0>, and outputs a register set address EMRSAZ<0>. An inverter IV9 inverts the register set address EMRSA<1>, and outputs a register set address EMRSAZ<1>. An inverter IV10 inverts the register set address EMRSA<2>, and outputs a register set address EMRSAZ<2>.

A NAND gate ND4 performs a NAND operation on the register set address EMRSAZ<0> and the register set address EMRSAZ<1>. A NAND gate ND5 performs a NAND operation on an output signal from the NAND gate ND4 and the register set address EMRSAZ<2>. An inverter IV11 inverts an output signal from the NAND gate ND5, and outputs the control signal PASR_BK1.

A NAND gate ND6 performs a NAND operation on the register set address EMRSA<0> and the register set address EMRSAZ<1>. A NAND gate ND7 performs a NAND operation on the register set address EMRSAZ<2> and an output signal from the NAND gate ND6.

A NOR gate NOR1 performs a NOR operation on output signals from the NAND gates ND5 and ND7 to output a control signal PASR_BK23.

A NAND gate ND8 performs a NAND operation on the register set addresses EMRSA<0>, EMRSAZ<1> and EMRSA<2>. A NAND gate ND9 performs a NAND operation on the register set addresses EMRSAZ<0>, EMRSA<1> and EMRSA<2>. An inverter IV12 inverts an output signal from the NAND gate ND8 to output a control signal PASR_BH. An inverter IV13 inverts an output signal from the NAND gate ND9 to output a control signal PASR_BQ.

The operation of the PASR controller 45 is described.

Since the self-refresh signal SREF is inactivated in a normal mode, the register set address EMRSA<0:2> becomes at a low level (see FIG. 10). As a result, the control signals PASR_BK1 and PASR_BK23 become at a high level, and the control signals PASR_BH and PASR_BQ become at a low level.

In a self-refresh mode, the register set address EMRSA<0:2> represents the level of the address ADD<0:2> inputted with the EMRS command. When the EMRS command is inputted, the level of the control signals change depending on the states of each address ADD<0>, ADD<1> and ADD<2> like the following.

As shown in FIG. 4, if the EMRS code is "ALL BANKS", the control signals PASR_BK1 and PASR_BK23 become at the high level, and the control signals PASR_BH and PASR_BQ become the low level.

If the EMRS code is a "HALF ARRAY", the control signal PASR_BK1 becomes at the high level, and the control signals PASR_BK23, PASR_BH and PASR_BQ become at the low level.

If the EMRS code is a "QUARTER ARRAY", the control signals PASR_BK1, PASR_BK23, PASR_BH and PASR_BQ become at the low level.

If the EMRS code is a "HALF OF BANK", the control signal PASR_BH becomes at the high level, and the control signals PASR_BK1, PASR_BK23 and PASR_BQ become at the low level.

If the EMRS code is a "QUARTER OF BANK", the control signal PASR_BQ becomes at the high level, and the control signals PASR_BK1, PASR_BK23 and PASR_BH become at the low level.

The PASR controller 45 selectively outputs the control signals PASR_BH and PASR_BQ for identifying the PASR types on a bank, and the control signals PASR_BK1 and PASR_BK23 for selectively activating the RAS generators 70~90 depending on the preset EMRS codes of FIG. 4.

Figure 12:
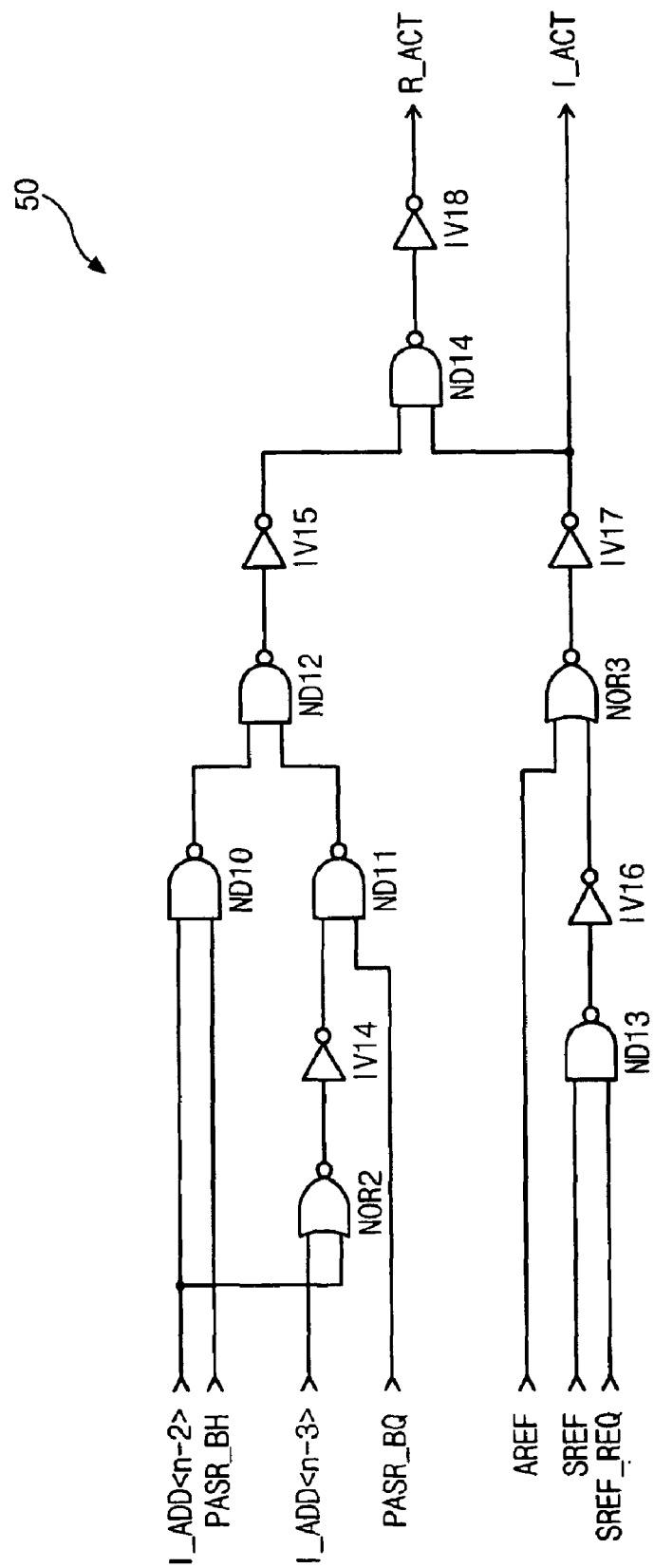
FIG. 12 is a detailed circuit diagram illustrating a refresh controller of FIG. 6.

FIG. 12 is a detailed circuit diagram illustrating the refresh controller 50 of FIG. 6.

A NAND gate ND10 performs a NAND operation on the internal address I_ADD<n-2> and the control signal PASR_BH. A NOR gate NOR2 performs a NOR operation on the internal addresses I_ADD<n-2> and I_ADD<n-3>. An inverter IV14 inverts an output signal from the NOR gate NOR2. A NAND gate ND11 performs a NAND operation on an output signal from the inverter IV14 and the control signal PASR_BQ. A NAND gate ND12 performs a NAND operation on output signals from the NAND gates ND10 and ND11. An inverter IV15 inverts an output signal from the NAND gate ND12.

An NAND gate ND13 performs a NAND operation on the self-refresh signal SREF and the self-refresh request signal SREF-REQ. An inverter IV16 inverts an output signal from the NAND gate ND13. A NOR gate NOR3 performs a NOR operation on the auto-refresh signal AREF and an output signal from the inverter IV16. An inverter IV17 inverts an output signal from the NOR gate NOR3 to output the internal operation signal I_ACT.

A NAND gate ND14 performs a NAND operation on output signals from the inverters IV15 and IV17. An inverter IV18 inverts an output signal from the NAND gate ND14 to output the refresh operation signal R_ACT.

Figure 13:
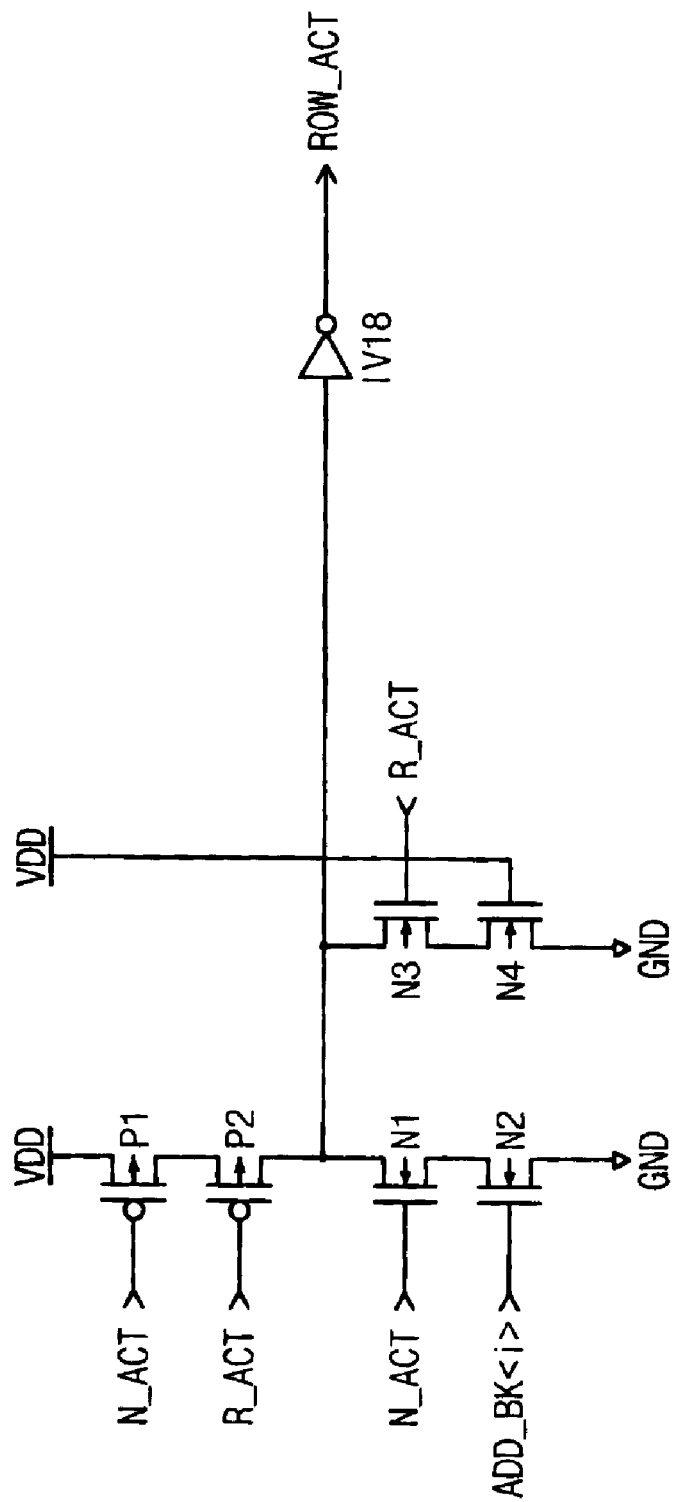
FIG. 13 is a detailed circuit diagram illustrating a RAS generator <0> of FIG. 6.

FIG. 13 is a detailed circuit diagram illustrating the RAS generator 60 of FIG. 6.

The RAS generator 60 comprises PMOS transistors P1 and P2, and NMOS transistors N1 and N2 connected in series between power voltage VDD and ground GND. Here, a gate of the PMOS transistor P1 receives a normal operation signal N_ACT, and a gate of the PMOS transistor P2 receives a refresh operation signal R_ACT.

A gate of the NMOS transistor N1 receives the normal operation signal N_ACT, and a gate of the NMOS transistor N2 receives the bank selecting address ADD_BK<0>.

NMOS transistors N3 and N4 connected in series between a command drain of the PMOS transistor P2 and the NMOS transistor N1 and a ground GND. Here, a gate of the NMOS transistor N3 receives the refresh operation signal R_ACT, and a gate of the NMOS transistor N4 receives a power voltage VDD.

An inverter IV18 inverts an output signal from a common drain of the NMOS transistors N1 and N3, and outputs a row active signal ROW_ACT<0> for activating the bank 160.

Figure 14:
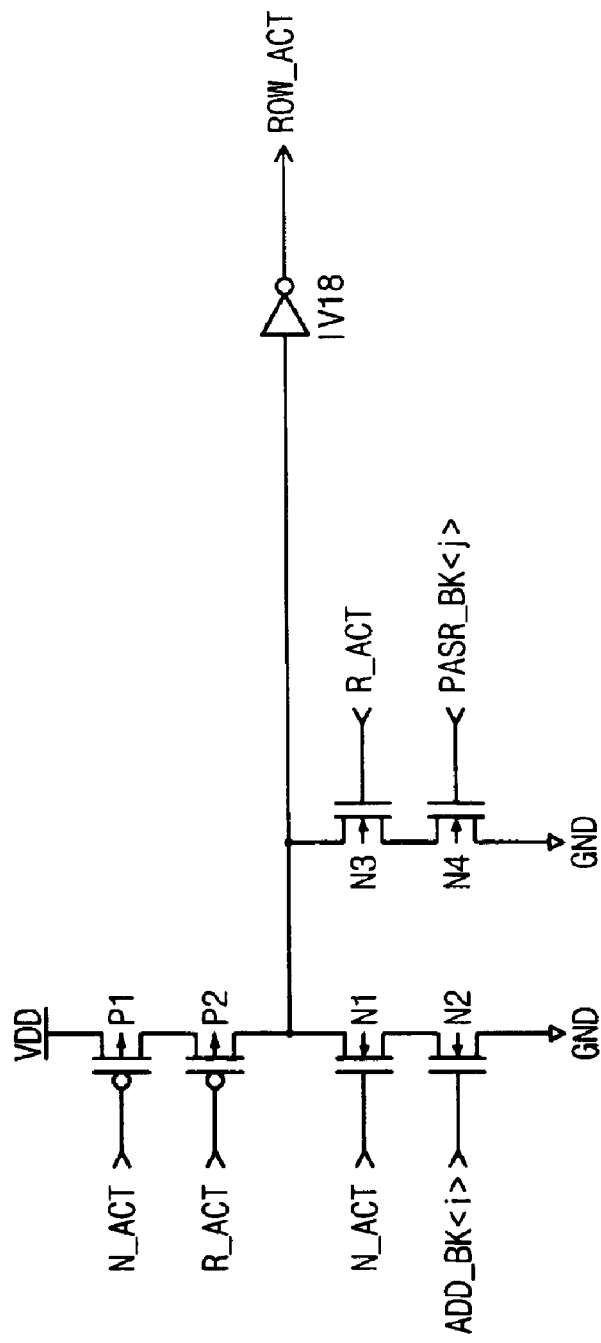
FIG. 14 is a detailed circuit diagram illustrating a RAS generator <1>~<3> of FIG. 6.

FIG. 14 is a detailed circuit diagram illustrating the RAS generators 70~90 of FIG. 6.

The configuration of the RAS generators 70~90 is the same as that of the RAS generator 60 of FIG. 13 except that a gate of the NMOS transistor N4 receives the control signal PASR_BK<j> (j=1, 23).

In the RAS generator 60 unlike the RAS generators 70~90, the bank 160 is always selected regardless of the PASR types in a refresh mode because the gate of the NMOS transistor N4 connected to a power voltage VDD does not receive a control signal from the PASR decoder 40.

If a command CMD representing the EMRS is externally inputted, the command decoder 20 activates the mode register set signal MREGSET.

The PASR decoder 40 decodes the mode register set signal MREGSET and the addresses ADD<0:2>, ADD<n> and ADD<n-1> buffered in the address buffer 10, and outputs a control signal depending on the EMRS codes. The latched information in the PASR decoder 40 is maintained at a latched state before other EMRS code are inputted.

In a normal mode, the PASR decoder 40 activates the control signals PASR_BK1 and PASR_BK23 so that the RAS generators 70~90 may be activated.

If one of the RAS generators 60~90 is activated depending on the states of the bank selecting addresses ADD<n> and ADD<n-1>, one of the banks 160~190 is activated in response to the row active signal ROW_ACT. The row address pre-decoder 110 generates the row address ROW_ADD<0:n-2> by decoding the external address ADD<0:n-2> of the corresponding bank, thereby activating corresponding wordlines of a selected bank.

If the self-refresh command SREFCMD is externally inputted, the self-refresh signal SREF representing a self-refresh state is activated by the command decoder 20. If the self-refresh signal SREF is activated, the PASR decoder 40 decodes the latched PASR information to output the control signals PASR_BK1 and PASR_BK23, PASR_BH and PASR_BQ into the RAS generators 70~90 and the refresh controller 50, respectively.

As the self-refresh signal SREF is activated, the refresh counter 30 operates a refresh oscillator to generate a self-refresh requiring signal SREF_REQ in a predetermined cycle and output the signal into the refresh controller 50.

As the self-refresh signal SREF is activated, the refresh controller 50 generates the internal operation signal I_ACT in response to the self-refresh requiring signal SREF_REQ and generates the refresh operation signal R_ACT in response to the control signals PASR_BH and PASR_QH and the internal addresses I_ADD<n-2> and I_ADD<n-3>.

When the EMRS code is "ALL BANKS" in a self-refresh mode, the control signals PASR_BK1 and PASR_BK23 of the PASR decoder 40 are outputted at the high level. As a result, the RAS generators 60~90 are maintained at an active state. The row address pre-decoder 110 receives the internal address I_ADD<0:n-2> from the internal address counter 100, and outputs the address as the row address ROW_ADD<0:n-2> so that corresponding wordlines may be activated in all banks 160~190.

When the EMRS code is a "HALF ARRAY" in a self-refresh mode, the PASR decoder 40 activates the control signal PASR_BK1 but inactivates the control signal PASR_BK23. As a result, only the RAS generators 60 and 70 are activated. The row address pre-decoder 110 receives the internal address I_ADD<0:n-2> from the internal address counter 100, and outputs the address as the row address ROW_ADD<0:n-2> to activate corresponding wordlines in the banks 160 and 170. Since the RAS generators 80 and 90 are inactivated in response to the control signal PASR_BK23, the banks 180 and 190 do not operate.

When the EMRS code is a "QUARTER ARRAY" in a self-refresh mode, the PASR decoder 40 inactivates the control signals PASR_BK1 and PASR_BK23. As a result, only the RAS generator 60 is maintained at an active state. The row address pre-decoder 110 receives the internal address I_ADD<0:n-2> from the internal address counter 100, and outputs the address as the row address ROW_ADD<0:n-2>, thereby activating corresponding wordlines in the bank 160. Since the RAS generators 70~90 are inactivated in response to the control signals PASR_BK1 and PASR_BK23, the banks 170~190 do not operate.

Figure 15:
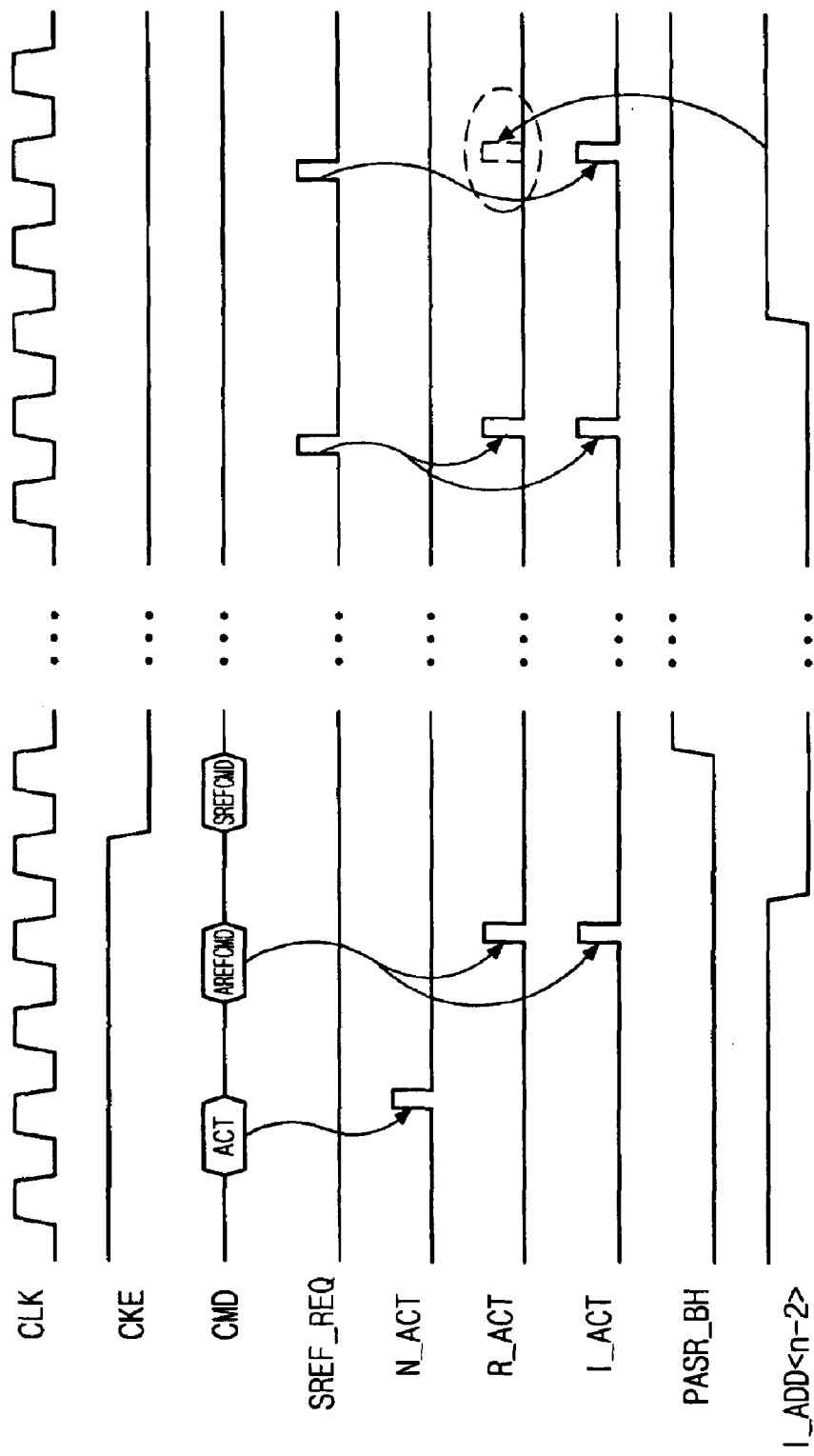
FIG. 15 is a timing diagram illustrating the operation of control signals for controlling the RAS generator of FIG. 14.

FIG. 15 is a timing diagram illustrating the operation of control signals for controlling the RAS generator.

FIG. 15 shows the states of the refresh operation signal R_ACT and the internal operation signal I_ACT depending on phase change of the internal address I_ADD<n-2> when the EMRS code is a "HALF OF BANK" during the PASR operation.

As described above, if the active command ACT is inputted in a normal mode, the normal operation signal N_ACT is activated, and the control signals PASR_BK1 and PASR_BK23 are also activated. As a result, the RAS generators 60~90 become at an active state.

Next, if the auto-refresh command AREFCMD is externally inputted, the command decoder 20 outputs the auto-refresh signal AREF into the refresh controller 50. The refresh controller 50 which receives the auto-refresh signal AREF activates the refresh operation signal R_ACT and the internal operation signal I_ACT, and outputs the signals into the RAS generators 60~90 and the internal address counter 100.

Here, the control signal PASR_BH is at the low level on a "HALF OF BANK", and the refresh operation signal R_ACT is not controlled. The internal address counter 100 performs a count operation by activation of the internal operation signal I_ACT. As a result, the internal address I_ADD<n-2> toggles after the preset time, and transits to a low level.

If the self-refresh command SREFCMD is inputted when the EMRS code is a "HALF OF BANK", the control signal PASR_BH of the PASR decoder 40 is activated, and the control signals PASR_BQ, PASR_BK1 and PASR_BK23 are inactivated since the EMRS codes are A2=1, A1=0 and A0=1 in FIG. 4. As a result, the RAS generators 70~90 are inactivated, and the banks 170~190 do not operate.

The row address pre-decoder 110 generates the row address ROW_ADD<0:n-2> by decoding the internal address I_ADD<0:n-2> counted in the internal address counter 100 so that corresponding wordlines may be activated in the bank 160. If the wordlines are consecutively activated and the self-refresh operation is completed on a half of the bank 160, the internal address I_ADD<n-2> generated on the internal address counter 100 becomes at a high level on the rest half of the bank 160.

In the interval 16 where the internal address I_ADD<n-2> becomes at the high level, the refresh controller 50 prevents the self-refresh requiring signal SREF_REQ from being transmitted into the refresh operation signal R_ACT. As a result, the refresh operation signal R_ACT is inactivated. If the refresh operation signal R_ACT is inactivated, the RAS generator 60 is also inactivated, and the bank 160 does not operate. As a result, the self-refresh operation is performed on a half of the bank 160.

However, since the internal operation signal I_ACT generated from the refresh controller 50 is not controlled by the control signal PASR_BH as shown in FIG. 12, the internal operation signal I_ACT is generated in response to the self-refresh requiring signal SREF_REQ regardless of the PASR types. As a result, the internal address counter 100 performs a count operation on all addresses during a predetermined refresh rate although the self-refresh operation is not performed on the rest half of the bank 160.

The refresh operation signal R_ACT for activating the RAS generators 60~90 is generated until a predetermined internal address is counted. The internal operation signal I_ACT is generated on the whole bank 160 in response to the self-refresh request signal SREF_REQ. Although the refresh operation is performed on cell arrays corresponding to the half of the bank 160 ("HALF OF BANK") during the predetermined refresh rate, the whole cell arrays of the bank 160 are counted. As a result, the refresh operation starts from the first wordline 11 of the bank 160 although the auto-refresh operation is performed after completion of the corresponding PASR operation. That is, each wordline is refreshed per refresh rate of 64 msec.

When the EMRS code is a "QUARTER OF BANK" in a self-refresh operation, the PASR codes are A2=1, A1=1 and A0=0. As a result, the control signal PASR_BQ of the PASR decoder 40 is activated, and the control signals PASR_BH, PASR_BK1 and PASR_BK23 are maintained at the inactivated state. Then, the RAS generators 70~90 are inactivated, and the banks 170~190 do not operate.

The row address pre-decoder 110 generates the row address ROW_ADD<0:n-2> by decoding the internal address I_ADD<0:n-2> counted in the internal address counter 100, thereby activating wordlines in the bank 160. If the wordlines are consecutively activated, and the self-refresh operation is completed on the quarter of the bank 160, the internal address I_ADD<n-3> generated from the internal address counter 100 becomes at the high level on the next quarter of the bank 160.

In an interval where the internal address I_ADD<n-3> becomes at the high level, the refresh controller 50 prevents the self-refresh request signal SREF_REQ from being transmitted into the refresh operation signal R_ACT. As a result the refresh operation signal R_ACT is inactivated.

In an interval corresponding to the rest half of the bank 160, the internal address I_ADD<n-3> becomes at the low level again. However, since the internal address I_ADD<n-2> becomes at the high level like the above-described "HALF OF BANK", the refresh operation signal R_ACT is continuously maintained at the inactivated state.

If at least one of two most significance bites (MSBs) in the bank 160 becomes at a high level, the refresh operation signal R_ACT is inactivated. However, since the internal operation signal I_ACT is not controlled by the internal addresses I_ADD<n-2> and I_ADD<n-3> and control signals PASR_BH and PASR_BQ, the internal operation signal I_ACT is generated in response to the self-refresh requiring signal SREF_REQ regardless of the PASR types.

Although the self-refresh operation is not performed on the rest three quarters of the bank 160, all addresses of the bank 160 are counted during the predetermined refresh rate.

As discussed earlier, when a partial array self-refresh (half of bank or quarter of bank) operation is performed, a self-refresh operation is performed until a predetermined internal address is counted depending on PASR types. However, counting for the internal address is performed for the whole internal address. As a result, the error of refresh rate can be prevented.

What is claimed is:

1. A self-refresh apparatus comprising:
an internal address counter for outputting internal address in response to an internal operation signal;
a refresh controller for outputting the internal operation signal having a predetermined cycle in response to refresh command signals, and outputting a refresh operation signal having the predetermined cycle for selectively activating a bank when a partial bank refresh signal is applied for performing a partial array self-refresh on a bank; and
a row address strobe generator for selectively activating the bank in response to the refresh operation signal.

2. The apparatus according to claim 1, further comprising:
a command decoder for decoding a refresh command inputted externally, and for outputting the refresh command signal and a mode register set signal;
a refresh counter for outputting a signal having a predetermined cycle corresponding to a refresh rate in response to a self-refresh command signal out of the refresh command signals;
a partial array self-refresh decoder for decoding and latching an extended mode register set code in response to the mode register set signal, and for selectively activating a plurality of control signals for performing a partial array self-refresh operation including the partial bank refresh signal by logically operating the latched code, in response to the self-refresh command signal; and
a row address pre-decoder for decoding the internal address into a row address and for outputting the row address.

3. The apparatus according to claim 2, wherein a plurality of control signals outputted from the partial array self-refresh decoder include a first control signal for selectively activating the row address strobe generator in response to a partial array self-refresh type, and second and third control signals for identifying the partial bank refresh signal.

4. The apparatus according to claim 3, wherein the refresh controller controls the refresh operation signal depending on states of the most significant bit of the internal address when the second control signal is activated.

5. The apparatus according to claim 3, wherein the refresh controller controls the refresh operation signal depending on states of the second most significant bit of the internal address when the third control signal is activated.

6. The apparatus according to claim 3, wherein the partial array self-refresh decoder decodes a 3 least significant bits of applied address and selectively outputs one of the first, second and third control signals.

7. The apparatus according to claim 3, wherein the row address strobe generator comprises:

a first row address strobe generator for selectively activating the bank in response to the refresh operation signal in a refresh mode; and a second row address strobe generator for selectively activating the other banks in response to the first control signal and the refresh operation signal in a refresh mode.

8. The apparatus according to claim 2, wherein the partial array self-refresh decoder comprises:

an extended mode register set decoder for decoding bank selecting address in response to the mode register set signal, and for outputting a register set control signal;

a plurality of address latches for decoding and latching the extended mode register set code in response to the register set control signal; and a partial array self-refresh controller for selectively outputting one of the first, second and third control signals by logically operating the latched address.

9. The apparatus according to claim 1, wherein the refresh operation signal is selectively outputted in response to the partial bank refresh signal, and the internal operation signal is outputted in response to the signal having the predetermined cycle in a refresh mode regardless of the output of the refresh operation signal.

10. A self-refresh method for performing a partial array self-refresh operation on a semiconductor memory, wherein an internal address of the bank is continuously counted in a predetermined cycle corresponding to a refresh rate regardless of types of the partial array self-refresh when the partial array self-refresh operation is performed on a bank, and the bank is activated only when the internal address is counted to a predetermined address depending on types of the partial array self-refresh.

11. A self-refresh method for performing a partial array self-refresh operation on a semiconductor memory in response to an extended mode register set code, comprising:

the first step of activating a refresh operation signal for activating a bank and an internal operation signal for counting internal address when a partial array self-refresh command on a bank is applied;

the second step of checking state change of a specific bit of the counted internal address depending on types of the partial array self-refresh; and the third step of continuously activating the internal operation signal in a predetermined cycle regardless of state change of the specific bit, and of inactivating the refresh operation signal when the state of the specific bit is changed.

12. The method according to claim 11, wherein the second step checks state change of the most significant bit of the internal address when a self-refresh is performed on a half of a bank, and checks state change of the second most significant bit of the internal address when a self-refresh is performed on a quarter of the bank.

13. The method according to claim 12, wherein the internal operation signal and the refresh operation signal are pulse signals having a predetermined cycle corresponding to a refresh rate.

* * * * *